(12) United States Patent
Kuk et al.

(10) Patent No.: US 8,581,269 B2
(45) Date of Patent: Nov. 12, 2013

(54) MODULAR HIGH DENSITY LED ARRAY LIGHT SOURCES

(75) Inventors: Sola Anne Kuk, Toronto (CA); Yong Wang, Markham (CA); James Francis Farrell, Toronto (CA)

(73) Assignee: Lumen Dynamics Group Inc., Toronto (CA)

(*) Notice: Subject to any disclaimer, the term of this patent is extended or adjusted under 35 U.S.C. 154(b) by 0 days.

(21) Appl. No.: 13/576,837

(22) PCT Filed: Feb. 10, 2010

(86) PCT No.: PCT/CA2010/000172
§ 371 (c)(1),
(2), (4) Date: Aug. 2, 2012

(87) PCT Pub. No.: WO2011/097694
PCT Pub. Date: Aug. 18, 2011

(65) Prior Publication Data
US 2012/0305946 A1    Dec. 6, 2012

(51) Int. Cl.
*H01L 33/00* (2010.01)
(52) U.S. Cl.
USPC ............. 257/88; 257/E33.055; 257/E33.056

(58) Field of Classification Search
USPC .............................. 257/88, E33.055, E33.056
See application file for complete search history.

(56) References Cited

U.S. PATENT DOCUMENTS

2012/0018764 A1*   1/2012   Choi et al. ................. 257/99

* cited by examiner

*Primary Examiner* — Victor A Mandala
(74) *Attorney, Agent, or Firm* — Ridout & Maybee LLP

(57) ABSTRACT

A modular LED array light source comprises an assembly of a plurality of solid-state LED array modules. Modules are abutted to provide a large area, high intensity and high-density array that provides substantially uniform irradiance. Preferably, in each module, a linear or rectangular array of groups of LED is provided in which the density of LED die in the array is higher at ends or edges of the modules abutting other modules, to provide improved uniformity of irradiance over the illuminated area between modules. Particular arrangements of clusters of LEDs are provided that reduce or overcome the discontinuity or dip in irradiance due to edge or wall effects caused by the spacing of LED die from edges of the substrate/packaging of each module. These arrangements are advantageous for hermetically sealed LED array modules, for example, which require a minimum wall thickness for an effective seal.

27 Claims, 16 Drawing Sheets

MODULAR HIGH DENSITY LED ARRAY LIGHT SOURCES

CROSS-REFERENCE TO RELATED APPLICATIONS

This application is related to U.S. patent application Ser. No. 61/139,203, entitled "System, method and adjustable lamp head assembly for Ultrafast UV curing" and U.S. patent application Ser. No. 61/161,281, entitled "Distributed Light Sources for Photo-reactive curing", which are incorporated herein by reference.

TECHNICAL FIELD

This invention relates to array light sources, light source arrays comprising solid state light emitting devices (LEDs), and particularly to high density modular LED array light source for applications such as high speed printing and photocuring, and apparatus using LED array light sources.

BACKGROUND

Many inks, adhesives and other curable coatings comprise free radical based or cationic formulations which may be photo-cured by exposure to light, typically ultraviolet (UV) or short wavelength visible radiation. Applications include curing of large area coatings, adhesive curing, as well as the print processes such as inkjet printing. Curing uniformity is critical for many large area photo-induced curing processes.

For example, UV curable free radical based photo-reactive inks have increased in popularity for use in inkjet printers. Such inks are usually jetted on top of a substrate with one or more layers and pass under a UV or visible light source for curing. Photo-initiators in the ink formulation are activated by photons, e.g. UV light energy, to create free radicals, which are highly reactive with other components in the ink such as monomers and oligomers. The resulting free-radical initiated polymerization or cross-linking reaction results in a solidified ink layer. In a typical inkjet application, the irradiation period occurs in a fraction of a second or less. When the ink leaves the irradiation zone, polymerization or solidification may continue, which is referred to as dark reaction. Such printers can print on flexible substrates such as polyvinyl chloride (PVC) and other flexible polymeric materials, and rigid substrates such as metal, wood and plastics.

Typical parameters to assess a UV inkjet printer include print quality, print speed, print width, type of substrate, reliability, for example. Among these, the combination of print quality and speed is often considered most challenging. Besides the print heads, which controls how ink droplets are jetted, UV light sources used for curing play an important role in the influence of print quality and speed. Traditional UV light sources used in inkjet printers are typically mercury (Hg) arc lamps and another class of Hg lamp, a microwave or electrode-less bulb, although other gas discharge lamps, may also be used. These lamps provide high enough power to cure most types of inks at print speeds used in the industry to date and are used in low cost and high cost printer systems. However, the amount of heat irradiated from gas discharge lamps is usually very high, which places constraints on system design. Overheating may cause operational and maintenance problems. Excessive heat also limits the ability of inkjet printers to print on some heat sensitive substrates. However, if the lamp power is lowered to avoid deleterious heating effects, there may be a trade off, e.g. in lower print quality and speed, or curing may not be achieved at all.

In recent years, solid state light emitting devices (LEDs), such as light emitting diodes, have been developed as alternative light sources for industrial processes, such as photoreactive or photo-initiated processes, e.g. photo-curing of inks, adhesives and other coatings. LEDs are more energy efficient than traditional gas discharge lamps. Solid-state light sources may also be preferred for environmental reasons, as well as longer lifetime. UV LEDs have attracted a lot of attention because they generate much less heat and consume much less power than gas discharge lamps, for the same light output.

UV LED sources commonly used in the inkjet industry have lines or arrays of a large number of LEDs packed closely to each other so that jetted ink layers receive continuous irradiation. Many of the applications of UV LED sources in inkjet printers use arrays of packaged LED devices or chip-on-board die with direct illumination so that light is spread out or diffused. Examples of such arrangements are described in US Patent Publication No. US2007/0013757 by Mimaki and in U.S. Pat. No. 7,137,696 to CON-TROL-CURE. These arrangements may have difficulty in achieving a uniform beam profile and an intensity that is high enough for good print quality for some applications. More densely packed LED chips may be provided to achieve high intensity, however water cooling may then be required which adds to the system complexity and cost. An upper limit for irradiance of a densely packed LED array may also be limited by the packaging or mechanical housing of individual die that determines the minimum spacing between die.

Modular LEDs arrays are disclosed for example in U.S. Pat. No. 6,683,421 to Kennedy, entitled "Addressable semiconductor array light source for localized radiation delivery".

Copending U.S. patent application Ser. No. 61/161,281 by Sheng Peng and Guomao Yang, entitled "Distributed Light Sources for Photo-reactive curing" discloses a light source comprising a plurality of linear LED arrays for producing a beam profile with high intensity irradiated regions and a dark region in between. This type of irradiation pattern takes advantage of intervals of both photoreactions and dark reactions.

With available LED arrays, for high speed printing applications using very short exposure times of the substrate to be cured, an array formed from individually packaged LED die, or a single row of LED die, may not provide sufficient intensity, and it is necessary to provide a higher density array to provide a line, a band, multiple lines, or multiple bands of illumination of higher intensity. High density arrays for module assemblies are available, for example in linear LED arrays or rectangular or square LED arrays.

For wide format printing it may be required to provide a linear array light source of say 35 cm or more wide, made up of a number of linear array modules, which are each about 2-5 cm long, for example, that are abutted to form a long linear array.

A problem encountered with available LED arrays, is that a linear array of a single row of individual LED die, for example, may be closely spaced along the row, but, because of the packaging and housing surrounding a linear array of individual die, when two arrays are abutted, the spacing between adjacent LED die, on different modules may be about 7 mm, for example, i.e. much larger than the spacing between dies on the same module (see FIG. 1B). Similarly, high density square arrays are known, for example, as manufactured Enfis™, which use 5×5 diode arrays. These arrays may be arranged in groups to provide larger area high intensity arrays, for example as described in the above-mentioned U.S. Pat. No. 6,683,421(Kennedy). In another example, the LEDZero™ product, manufactured by Integration Technologies™, uses multiple LED arrays in a linear arrangement to provide a wide band of illumination.

In a typical square 5×5 LED array, for example, each LED die may be 1×1 mm$^2$, so that these arrays may be about 7 mm×7 mm. However, the arrays are fabricated on a substrate, which has a 1 mm to 2 mm edge that surrounds the individual die. The die may be hermetically sealed within the package, which required a minimum wall thickness around the LEDs, to provide a good seal. When these LED arrays are abutted, there is a gap or spacing between adjacent groups of LEDs, which may be 2 mm to 4 mm (see FIG. 1C). Thus, because of the thickness of the wall of the package or housing of available high density LED arrays and/or other design/assembly needs, there is a gap or spacing between LED die on neighbouring modules when they are abutted in a module assembly. This means that there is uniform intensity along the length or width of the each module, but there is a dip in intensity/irradiance in the region where each module abuts, which tends to cause a banding effect in the substrate being cured.

U.S. Pat. No. 6,450,664 to Stockeryale shows a modular LED array assembly, which provides a denser arrangement of LEDs near ends of the assembly to provide a uniform irradiance profile with a sharper edge, i.e. approaching a rectangular or "top hat" function. Similarly, U.S. Pat. No. 6,380,962 to Miyazaki provides an arrangement to provide an irradiance profile with a sharper edge using wider light source near ends of a linear light source. However, neither of these applications addresses the problem of providing a more uniform irradiance profile where two modules abut. In fact a sharp profile may exacerbate edge effects in modular arrays, i.e. creating a more marked discontinuity or dip in irradiance caused by the spacing where two modules abut, depending on the size of the gap or separation between LED elements due to the mechanical housing.

In another example, disclosed in U.S. Pat. No. 7,175,712, LEDs are arranged in staggered rows, and LED arrays are also staggered to provide a more uniform irradiance. However, because of the thickness of the substrate and packaging surrounding the array, this arrangement also does not overcome a discontinuity in irradiance around edges of the arrays, or where two arrays abut. There is a need for a high intensity modular LED array, which provides uniform irradiance over a large area, and avoids problems with a discontinuity in irradiance when two or more LED modules are abutted.

Not only is uniform irradiance desirable for effective curing, but also, since curing may also be wavelength dependent, improved UV LED array light sources that provide some degree of wavelength control are also desirable. Formulations and colours of inks and coatings vary from supplier to supplier, and for different application requirements. They have different curing requirements, including requiring different wavelengths of UV light. It is known that the appearance of a cured ink or coating film may be dependent on the wavelength of UV irradiation used for curing, and use of different wavelengths, e.g. 365 nm and 400 nm, may result in different surface finishes, e.g. matte or glossy surfaces. Typically, adding some 365 nm radiation to a 400 nm based LED source improves surface curing. It may also be desirable to provide flexibility for use of different wavelengths of UV because absorption, reflection of UV light by different colours of inks and coatings, as well as the substrate materials, may be very different.

The light output or intensity may be monitored by one or more photodiodes in each module of the array. Large arrays require a larger number of photodiodes to monitor intensity of each module and ensure uniform irradiance from module to module. These photodetectors also take up space in the array, and add to expense. It is also desirable to provide improved monitoring and control of the intensity from each module to provide uniform irradiance from module to module.

Thus, further improvements in modular LED array light sources are needed, particularly, for large area photo-curing or other photo-initiated processes.

SUMMARY OF INVENTION

The present invention seeks to overcome, or mitigate, the above-mentioned problems with known modular LED arrays and light sources, or at least provide an alternative.

Thus, one aspect of the present invention provides an LED array light source comprising: a plurality of LED modules, each module comprising a module substrate carrying a plurality of LED elements arranged in an array, each module having at least one edge portion of the substrate extending beyond the LED array and abutting that of another module; and the spacing of LED elements of the array in each module being arranged to provide a higher density of LED elements at edges of the array where two modules abut.

Preferably, the arrangement of LED die in each module provides for a substantially uniform irradiance from module to module where two modules abut.

For example, each module may comprise: a central region of the module comprising central LED elements of the array arranged along a length of the substrate, and end regions of the module comprising LED elements of an end portion of the LED array and the edge portion of the substrate extending lengthwise beyond the LED array. The LED elements of the array are arranged to provide a higher density of LED elements in the array near the ends or edges, so that the same average number of LED elements is provided per unit length of substrate in each central region of the array as over the end or edge region of the module, which includes the substrate in the connection region between modules.

In a preferred arrangement, each module comprises a central region the LED array arranged as a uniform periodic array of LED elements having a number n of die per unit length of the substrate, and an end region of the module near the edge of the array wherein die are arranged, so that, including the edge portion of the substrate extending beyond the LED array, there is an equal number n die per length of the substrate in end regions abutting other modules. Advantageously, the arrangement of LED die of the array in central and end regions of a module maximizes the packing density of individual die to provide a high intensity modular light source.

Thus, arrangements of LED die in each LED array provide for a substantially uniform irradiance where two modules abut, and reduce or overcome edge effects or wall effects, while preferably optimizing packing density for providing high optical power and irradiance in a single module.

Preferably, each module comprises a periodic array of a plurality of middle clusters of LED die along a length of the array, and an end cluster of LED die at each end of the length of the array near edge portions of the module, where two modules abut, wherein each end cluster comprises a greater number of LED die than said middle clusters.

Beneficially, the spacing of LED die in each middle cluster and end cluster, and the spacing between clusters is selected to provide high optical power and substantially uniform irradiance along the length of the array and across edge portions where two modules abut. For example, each middle cluster comprises at least one LED die and each end cluster comprises at least one additional LED die. Alternatively, each middle cluster comprises at least one pair of LED die, and each end cluster comprises at least one additional pair of die.

An LED array light source array may comprise a plurality of modules wherein each module comprises a linear array of LED die comprising middle clusters and end clusters of LED die, and each middle cluster comprises 4 LED die, and each end cluster comprises 6 LED die, and the spacing of end clusters and middle clusters is selected to provide high optical power and substantially uniform irradiance along the length of the light source array from module to module. In other arrangements, each LED module may comprise a rectangular array of LED die, each comprising middle clusters, edge clusters and corner clusters of LED die, and wherein the number of die and the spacing of middle, edge and corner clusters is selected to provide high optical power and substantially uniform irradiance from module to module.

Another aspect of the present invention provides an LED module comprising: a substrate, a plurality of LED die arranged in an array on a substrate wherein the density of LED die in the array is increased towards at least one edge of the module. Thus, where the LED array is a linear array of LED die, the number and spacing of LED die along a length of the array and near each end of the length of the array is selected to provide a greater density of die near ends of the array.

For example, where the substrate comprises part of a package having a wall extending around the LED die of the array, and an optical window overlying the array and hermetically sealed to the wall of the package, a minimum spacing of the end cluster from the edge or end of the substrate is required to accommodate the thickness of the wall.

By appropriate selection of the number of die in each middle and end cluster, and spacing between clusters, a high optical power and a substantially uniform irradiance can be provided along the length of the array where two modules abut, to reduce or overcome edge effects or wall effects.

Where each module comprises a plurality of middle clusters of m×n LED die and a plurality of end clusters of m×(n+1) LED die, with dies in each cluster having a dimension w and being spaced by a distance x, each middle cluster being spaced by a distance v, and each end cluster being spaced from an edge of the substrate, so that where two modules abut, end clusters in adjacent modules are spaced by a distance U, and wherein $$U = v + \frac{2}{n}(v - x).$$

In addition to the arrangement and spacing of the individual die or clusters of die in each module to reduce end effects where modules abut, so as to provide uniform irradiance, alternatively, other irradiance profiles may be produced. As is known, LED driver circuitry may provide for control of individual dies or clusters to provide particular output power and irradiance profile. Modules may comprise individual LED die having different output powers and wavelengths.

Advantageously, the LED array module further comprises optical monitoring means comprising: a light guide extending along the length of the LED array adjacent the array and a photodiode optically coupled to receive light from the light guide for monitoring the operational status of the array.

Preferably, the light guide comprises a fluorescent fiber light guide extending along one side of the length of the array and aligned to an edge of the optical window to receive a portion of light emitted from the LED array, and a photodiode optically coupled to one end of the fluorescent fiber light guide to receive light from the fiber indicative of the operational status of the array.

Another aspect of the invention provides an apparatus for optical monitoring of the operational status of an array of light emitting devices (LEDs) comprising: a fluorescent light guide extending along a length of the array, and optically coupled thereto to receive emission from a plurality of LEDs of the array; a photodiode coupled to an output of the fluorescent light guide for monitoring fluorescence indicative of the operational status of the array of LEDs.

In one preferred embodiment, where the LED array comprises an optical window overlying the LEDs of the array, and the fluorescent light guide comprises a fluorescent fiber light guide aligned along an edge of the optical window to receive light from the array, and the photodiode is coupled to one end of the optical fiber to monitor light output indicative of the operational status of LEDs of the array.

Yet another aspect of the invention provides a method of determining the operational status of LEDs of an LED array, comprising: coupling a fluorescent light guide along a length of the LED array to receive output from a plurality of LEDs of an LED array; coupling a photodiode to an output of the fluorescent light guide; powering LEDs of the array and monitoring, using the photodiode, the optical output from the fluorescent light guide to determine an operational status of LEDs of the array.

The method may comprise selectively powering individual ones or groups of LED die of the LED array to determine operational status thereof from the optical output of the fluorescent light guide.

Preferred embodiments of one aspect of the invention provides for linear or rectangular arrays, wherein LED die are arranged with a higher density near ends and/or edges of the LED array, to equalize the number of die per unit length of substrate in abutting and middle regions of a module, to compensate for spacing between modules caused by package/housing of each module. Thus, the arrangement of LED die in each module compensates for edge effects to provide uniform irradiance from module to module and between modules. The LED modules may also comprise temperature sensors, cooling elements comprising a heatsink, and optical monitoring means. LED modules may also comprise optical elements, such as lenses or reflectors to shape the output beam profile, and when LED modules comprise LEDs emitting two or more wavelengths, optical elements may be used to effect wavelength mixing or separation.

Modular LED array light sources that provide a wide band of illumination or irradiation with substantially uniform irradiance have applications for photo-curing or photo-processing of large area substrates and other processes requiring uniform illumination such as for imaging for test or measurement applications.

The foregoing and other objects, features, aspects and advantages of the present invention will become more apparent from the following detailed description, taken in conjunction with the accompanying drawings, of preferred embodiments of the invention, which description is by way of example only

BRIEF DESCRIPTION OF DRAWINGS

In the drawings, identical or corresponding elements in the different figures have the same reference numeral.

DESCRIPTION OF PREFERRED EMBODIMENTS

Figure 1A:
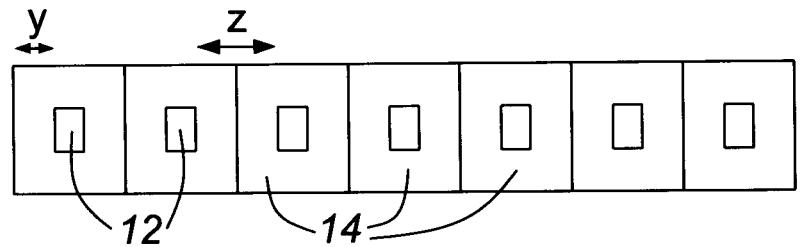
FIG. 1A shows an example of a known LED light source assembly comprising a plurality of individually packaged LED die, arranged in a linear array.
Figure 1B:
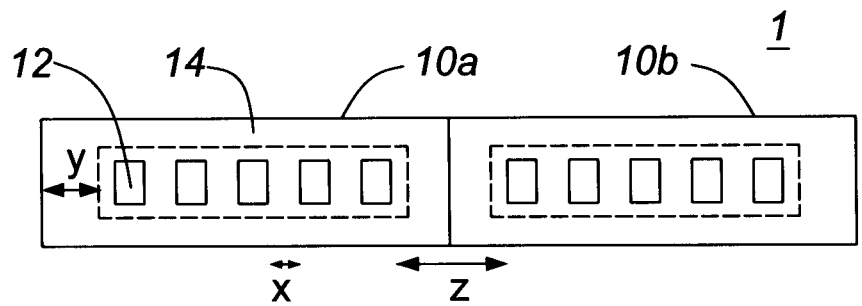
FIG. 1B and FIG. 1C show, schematically, examples of known LED light source arrays comprising a plurality of LED modules, arranged in a linear array and a rectangular array, respectively.
Figure 1C:
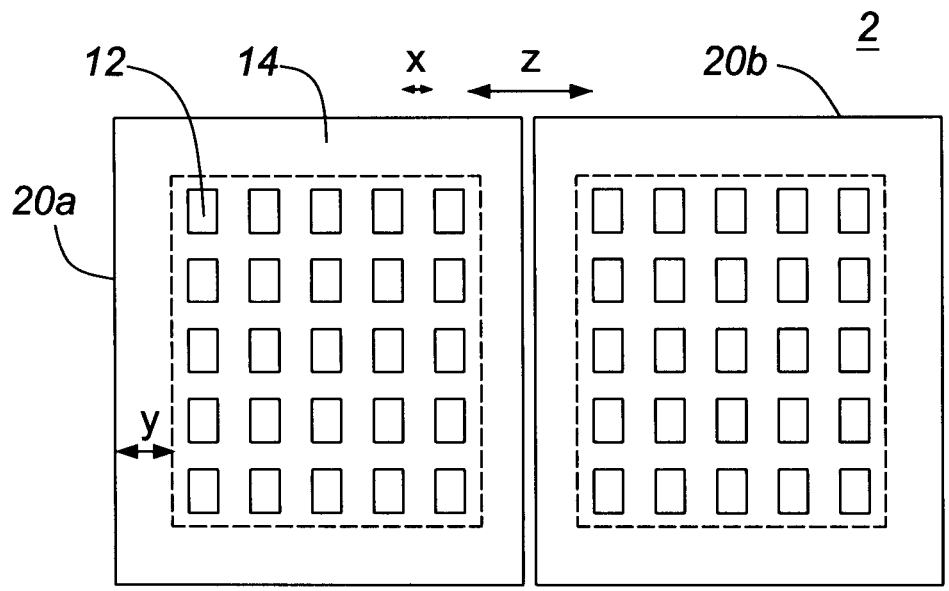

A conventional LED light source assembly comprising a plurality of off-the-shelf individually packaged LED elements or die 12, arranged uniformly in a linear array is shown schematically in FIG. 1A. For high intensity light source arrays, the die 12 are preferably closely spaced and packed as densely as possible, i.e. spaced by a distance z. However, the substrate 14 and individual packaging of each die 12 extends a distance y around each LED element, limiting the packing density of the die. To allow for a higher packing density, several die 12 may be mounted on a common substrate 14, to form an array module, e.g. module 10a, as shown in FIG. 1B. As shown schematically in FIG. 1B, a conventional modular LED die array light source 1 may comprise two or more LED modules 10a, 10b each comprising a plurality of LED die 12, in this case a 1×5 array, arranged uniformly in a linear array on a substrate 14. Correspondingly, a square or rectangular array 2 may be provided as shown schematically in FIG. 1C, comprising two or more rectangular LED modules 20a, 20b which each comprise a 5×5 array of LEDs 12. Typically, the individual LEDs are mounted on a substrate 14 in a uniformly spaced array, i.e. with spacing x between each die. The substrate 14 extends around the LED die, by a distance y, because the LEDs are usually enclosed in a package with an optical window overlying the LEDs, which is hermetically sealed around the edges of the array. The package requires a minimum wall thickness, y, around the LED die to provide an effective hermetic seal, or to provide space for otherwise sealing the array, e.g. by epoxy encapsulation. Thus, where two or more arrays 10a, 10b or 20a, 20b abut to form a larger area LED array light source, the difference in spacing, z, between LED die in adjacent module, relative to spacing, x, of LED die within an array module, causes a non-uniformity, i.e. a drop, in irradiance where the modules abut.

Figure 2A:
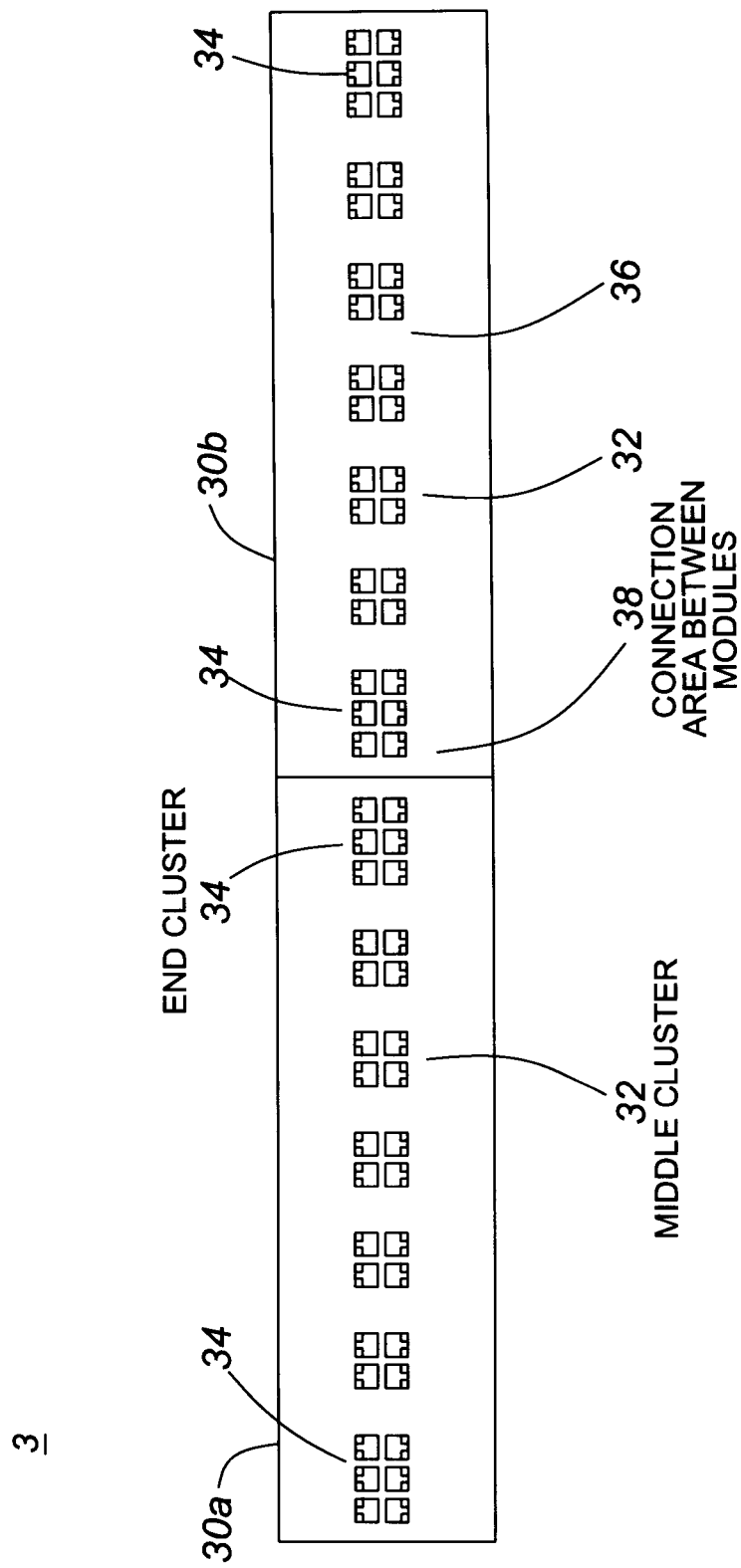
FIG. 2A shows schematically a modular LED light source comprising two LED array modules abutted side-by-side to form a linear array, according to a first embodiment of the present invention.
Figure 2B:
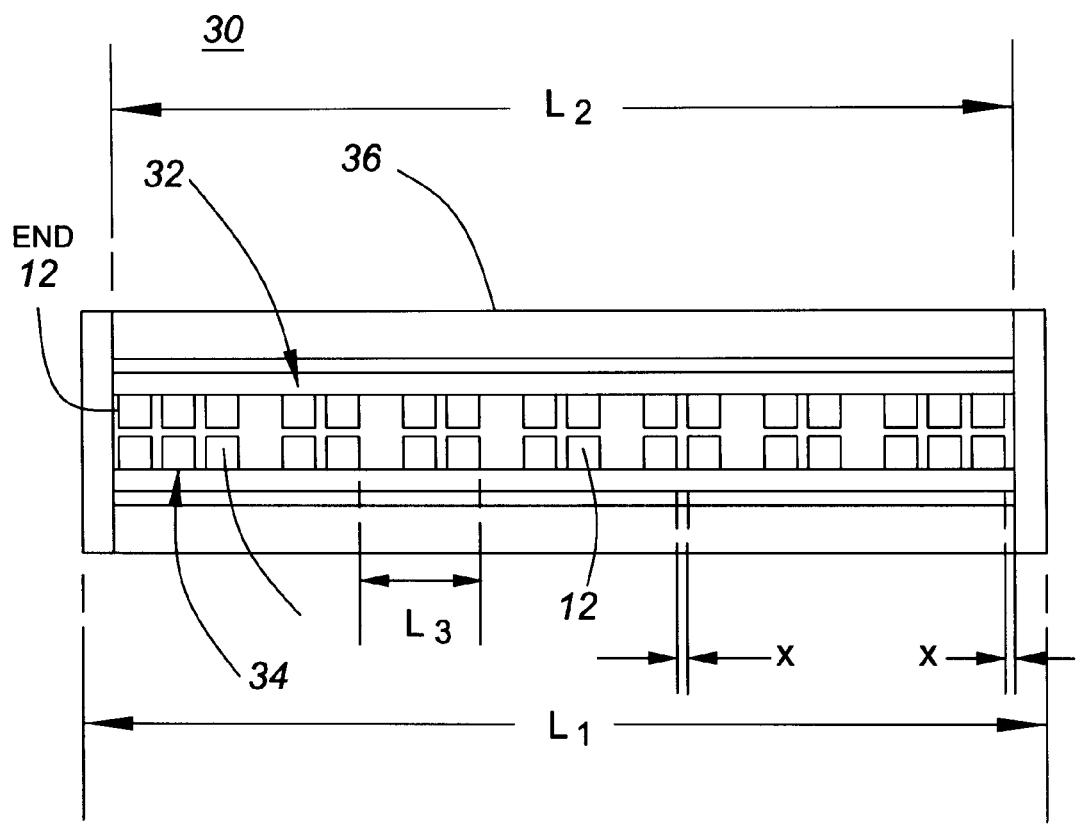
FIG. 2B shows exemplary dimensions of one module.
Figure 3A:
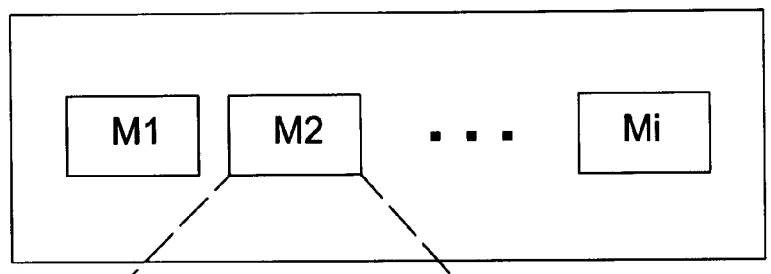
FIG. 3A shows a schematic diagram representing a modular LED light source comprising a plurality i of individual LED modules M1 to Mi arranged side-by-side to form a wide linear array.
Figure 3B:
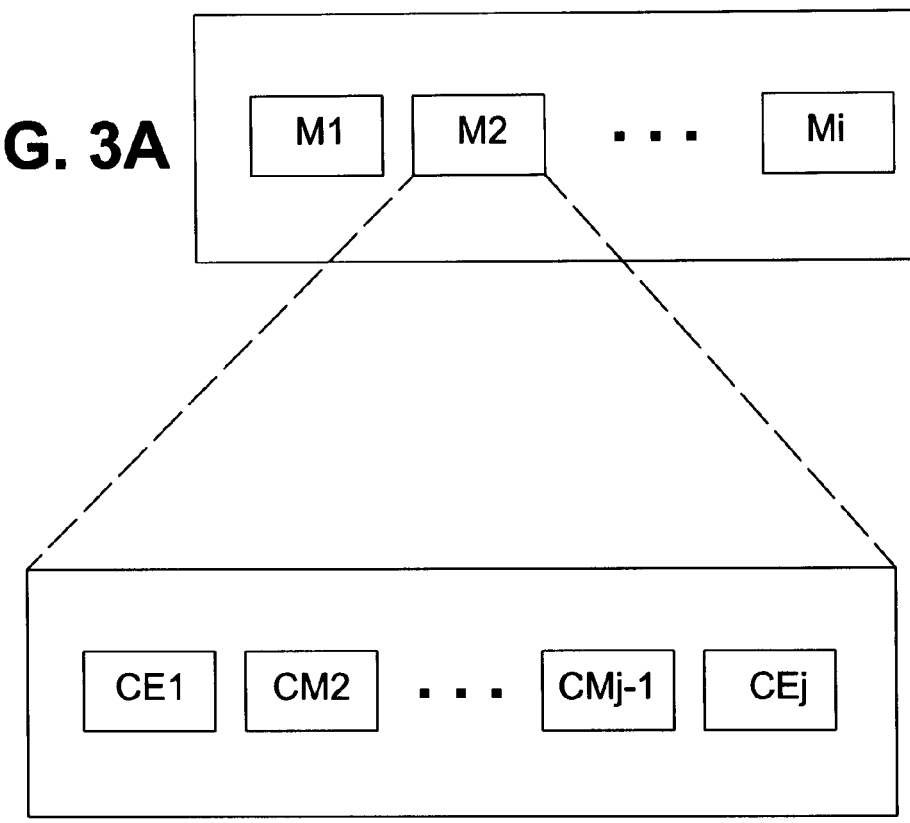
FIG. 3B shows an enlarged schematic diagram of one module illustrating an arrangement of j clusters of LED die comprising end clusters CE1 and CEj and middle clusters CM2, CMj−1.

A modular LED array light source 3 according to a first embodiment of the present invention is shown schematically in FIG. 2A and comprises two LED array modules 30a, 30b abutted side-by-side in a linear arrangement. In this example, each of the two LED modules 30a, 30b carries a linear array of pairs of LED die 12 on a substrate 36. The LED die are arranged in pairs, i.e. two rows, to form an array comprising five groups or middle clusters 32 each comprising 4 LED die arranged periodically with regular spacings, and end clusters 34 comprising 6 LED die at each end of the modules 30a, 30b. Exemplary dimensions of one module 30 are indicated, by way of example only, in FIG. 2B, i.e. each LED die may be 1×1 mm$^2$, and the individual die in each cluster are closely spaced by a distance x (0.2 mm). A cluster of four die is therefore 2.2 mm square. The middle clusters are arranged at intervals of distance $L_3$, for example 3.55 mm intervals, i.e. with 1.35 mm between clusters. End clusters each comprise 6 individual die arranged with similar spacing of 0.2 mm between die. The module substrate 36 carrying the LED die extends laterally all around the die by several mm, except at the ends 38 where the end group 34 of LED die are placed as close as possible to the end of the substrate where the modules 30a, 30b may abut end-to-end with the neighboring module. Thus the length of the array $L_2$ is 26.3 mm, and the length of the module $L_3$ including the wall thickness for sealing of the module is 28.34 mm. Preferably, the clusters 32, 34 of die 12 are packaged on a substrate 36 which is hermetically sealed around the edges, which requires a spacing of at least 1 mm between the LED die $12_{end}$ at the end of the array and the edge of the end portion of the package substrate 38, in the connection area between two modules. Thus, even if the modules are abutted as closely as possible, there is a space of about 2 mm between the die at the end of each module. To compensate for this gap between modules, the die grouping and spacing along the length of the module is arranged to compensate for wall/edge effects, i.e., by providing the extra pair of LED die in each of the end clusters and structuring the die clusters in a periodic manner. This embodiment, therefore, provides a high density and modular LED illumination source with increased optical power and improved uniformity of irradiance along the length of an LED array light source comprising two or more modules. By increasing the number or density of LED die in the array near the end portions of the modules that abut other modules and structuring the die clusters in a periodic manner as shown in FIG. 2A, a substantially uniform irradiance along the length of a light source unit comprising a plurality of linear LED array modules may be provided, and edge or wall effects are compensated for to avoid a dip in irradiance in the gap between conventional uniformly spaced LED array modules (such as those shown in FIGS. 1B and 1C). The resulting modular LED light source provides improved uniformity of irradiance for applications such as high speed printing and other photo-curing processes, to avoid banding effects caused by non-uniform irradiance along an extended array where modules abut.

Calculation of LED Die Distributions.

Figure 4:
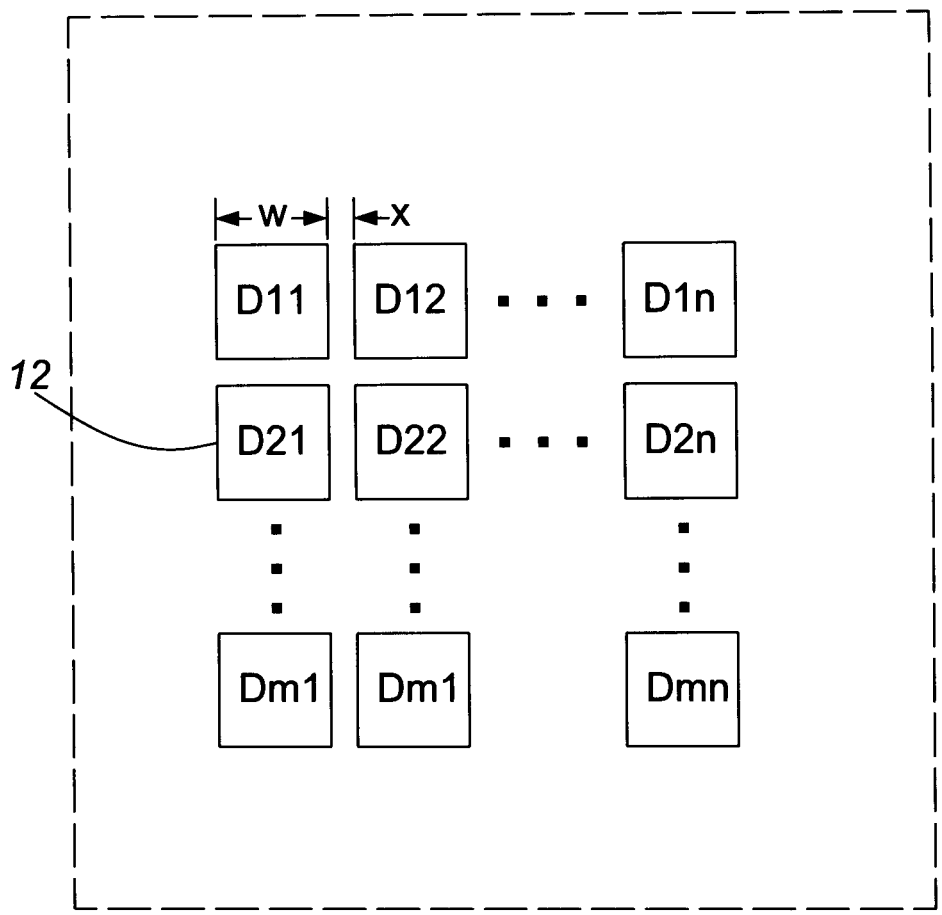
FIG. 4 shows an enlarged schematic view of one cluster of m×n individual LED die showing dimension w of each die and spacing x between dies.

To determine appropriate cluster arrangements and spacings for linear and rectangular LED array modules to provide more uniform irradiance in one or two dimensions, reference is made to FIGS. 3 to 8. FIG. 3A represents schematically a linear LED array light source comprising i modules M1, M2, to Mi. Each module Mi comprises j clusters of LED die as represented in FIG. 3B, comprising first and second end clusters of LED die denoted by CE1 and CEj, and a plurality of middle clusters of LED die CM2, CM3, ... CMj−1. For example, as illustrated in FIG. 4, in each middle cluster of m×n LED die, each die has a dimension w and uniform spacing between die 12 of dimension x.

Figure 5:
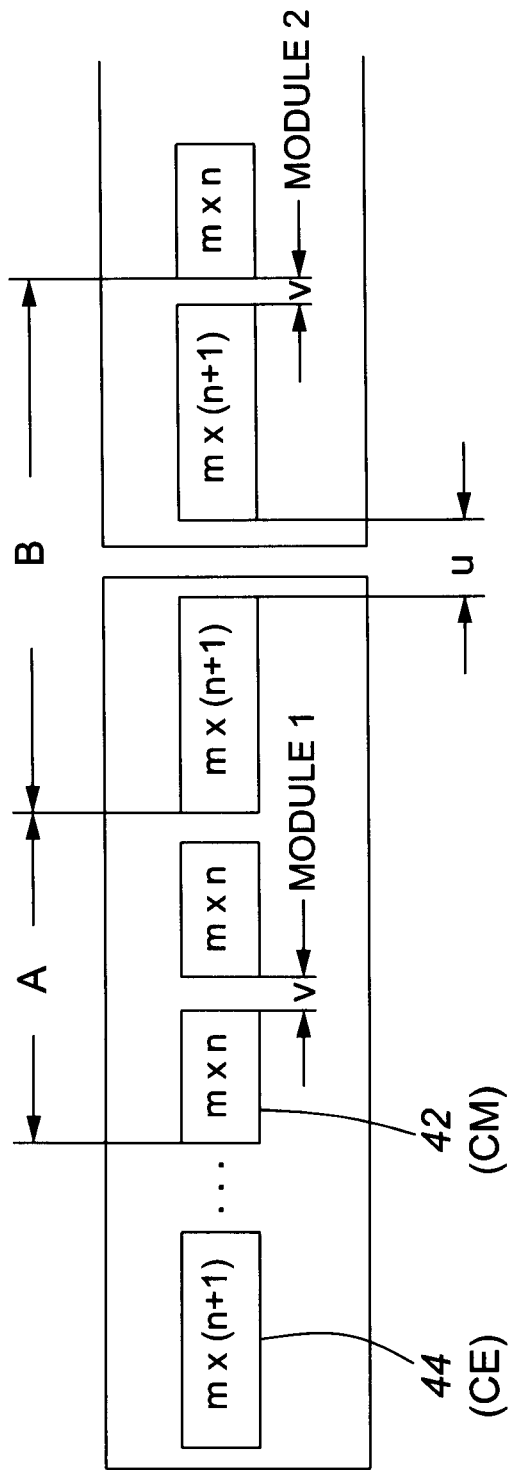
FIG. 5 shows a schematic diagram of two LED array modules showing dimensions used to calculate required spacings of the middle and end clusters of a linear modular LED array.

Thus, as illustrated in FIG. 5, considering a linear array of two or more LED modules 30, each module 30 comprises middle clusters (CM), i.e. a total of j−2 clusters, each have m×n LED die. End clusters (CE) each have m×(n+1) dies, i.e. a greater number of LED die to compensate for the wall thickness at the end of the module as explained above.

For this arrangement, the following assumptions are made in determining a general rule for spacing between LED clusters:

A) the variation of the optical output of the dies are flux binned. For example, output variations of the dies are less than ±10%;

B) the light source is a Lambertian source; conventional surface emitting LEDs approximate a Lambertian light source;

C) there is a certain distance>5 mm, recommended between the surface of the substrate and the die surface. For example this distance may be occupied by a reflector, cylindrical lens or tapered concentrator; and D) each module has j die clusters; each middle cluster has m rows and n columns.

End clusters have m×(n+1) dies to compensate for the gap between the modules relative to the space between adjacent clusters.

If middle clusters have a length A and the end clusters at the connection area have length B, as shown in FIG. 5, the space between modules to keep the number of dies per unit length the same is given by equation (1):

$$\frac{A}{2 \times n} = \frac{B}{2 \times (n+1)} \qquad (1)$$

Assuming the width of the die is w; the space between dies is x; the space between middle clusters is v; and the space between end clusters is U (FIG. 18):

$$A = 2 \times n \times w + 2 \times v + 2 \times (n-1) \times x \qquad (2)$$

$$B = 2 \times (n+1) \times w + v + U + 2 \times n \times x \qquad (3)$$

By substituting equations (2) and (3) into equation (1), U can be calculated from following equation:

$$U = v + \frac{2}{n}(v - x) \qquad (4)$$

As an example, if n=2, v=1.35, x=0.2, in a linear array configuration for a hermetically sealed package where the minimum wall thickness is 1 mm, then U=2.5.

Figure 6A:
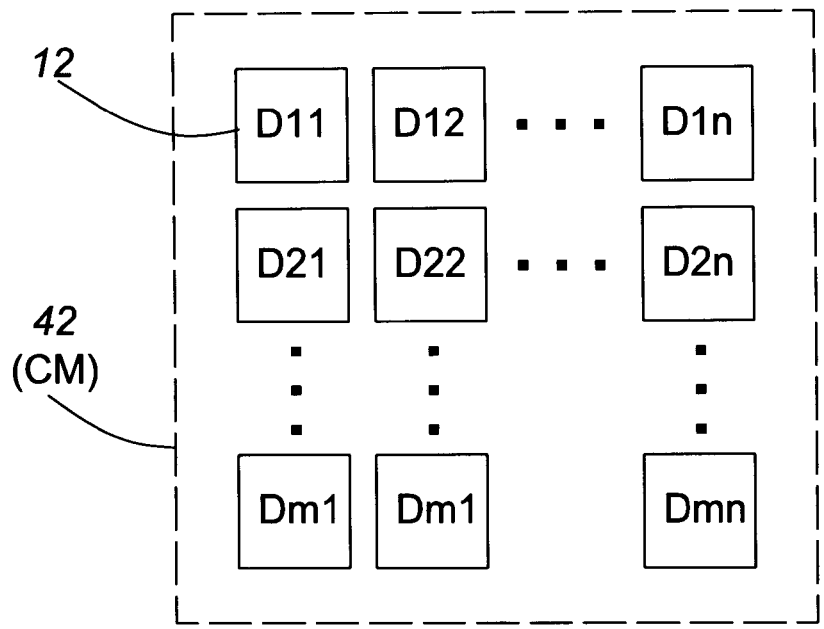
FIG. 6A show a schematic representation of a middle clusters of m×n LED die.
Figure 6B:
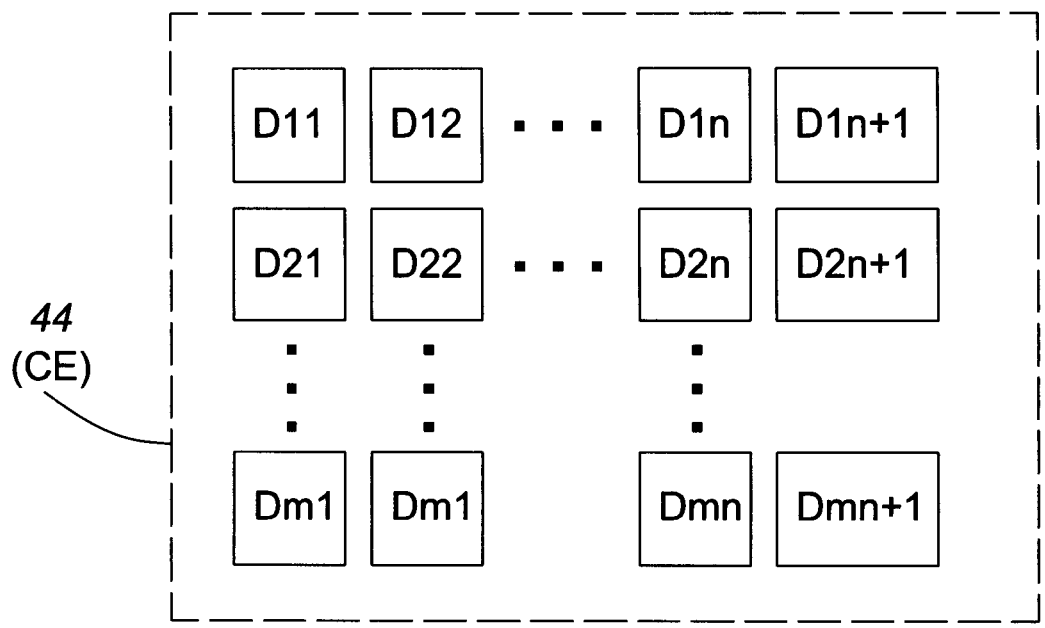
FIG. 6B shows a schematic representation of an end clusters of m×(n+1) LED die.

Appropriate spacings in a two dimensional rectangular array of a plurality of modules comprising middle clusters of m×n LED dies as shown in FIG. 6A, and end clusters comprising m×(n+1) LED die, as shown in FIG. 6B may be calculated to provide a substantially uniform irradiance from module to module at abutments along the length of an assembly comprising two or more LED array modules.

In other embodiments, a similar design principle may be applied to provide other arrangements of modular LED arrays. Large area modular LED light sources may be provided using LED array modules having various configurations of individual LEDs, LED pairs, or groups or clusters of multiple LEDs.

Generally, when each module comprising a module substrate carrying a plurality of LED elements arranged in a array; each module has at least one edge portion of the substrate extending beyond the LED array for abutting that of another module; and the spacing of LED light source elements of the array in each module being arranged to provides for a substantially uniform irradiance from module to module where two modules abut.

For modules comprising a linear array, if each module comprises a middle or central region of the module comprising central LED elements of the array arranged along a length of the substrate, and end regions of the module comprise LED elements of an end portion of the array and the edge portion of the substrate extending lengthwise beyond the LED array, then the LED elements of the array are arranged to provide the same average number of LED elements per unit length of substrate in each central region of the array and each end region, including the substrate/package wall thickness, of the module. To provide a high intensity array, the packing density of LED elements in the array of each module is preferably as high as possible, while compensating for the gap between LED elements from module to module. Thus preferably, each module comprises a central region the LED array arranged as a uniform periodic array of LED elements having a number n of die per unit length of the substrate, and an end region of the module near the edge of the array wherein die are arranged, so that, including the edge portion of the substrate extending beyond the LED array, there is an equal number n die per length of the substrate in end regions abutting other modules.

More generally, for linear or rectangular arrays, LED die are arranged such that there is an equal number of die per length of the module across the end region or abutting region of two modules compared to the central region of each individual module, i.e. a larger number of die in each cluster, near ends or edges of the modules, to compensate for the gap or spacing between modules, dependent on the thickness of the wall of the package/housing of each module.

Figure 7:
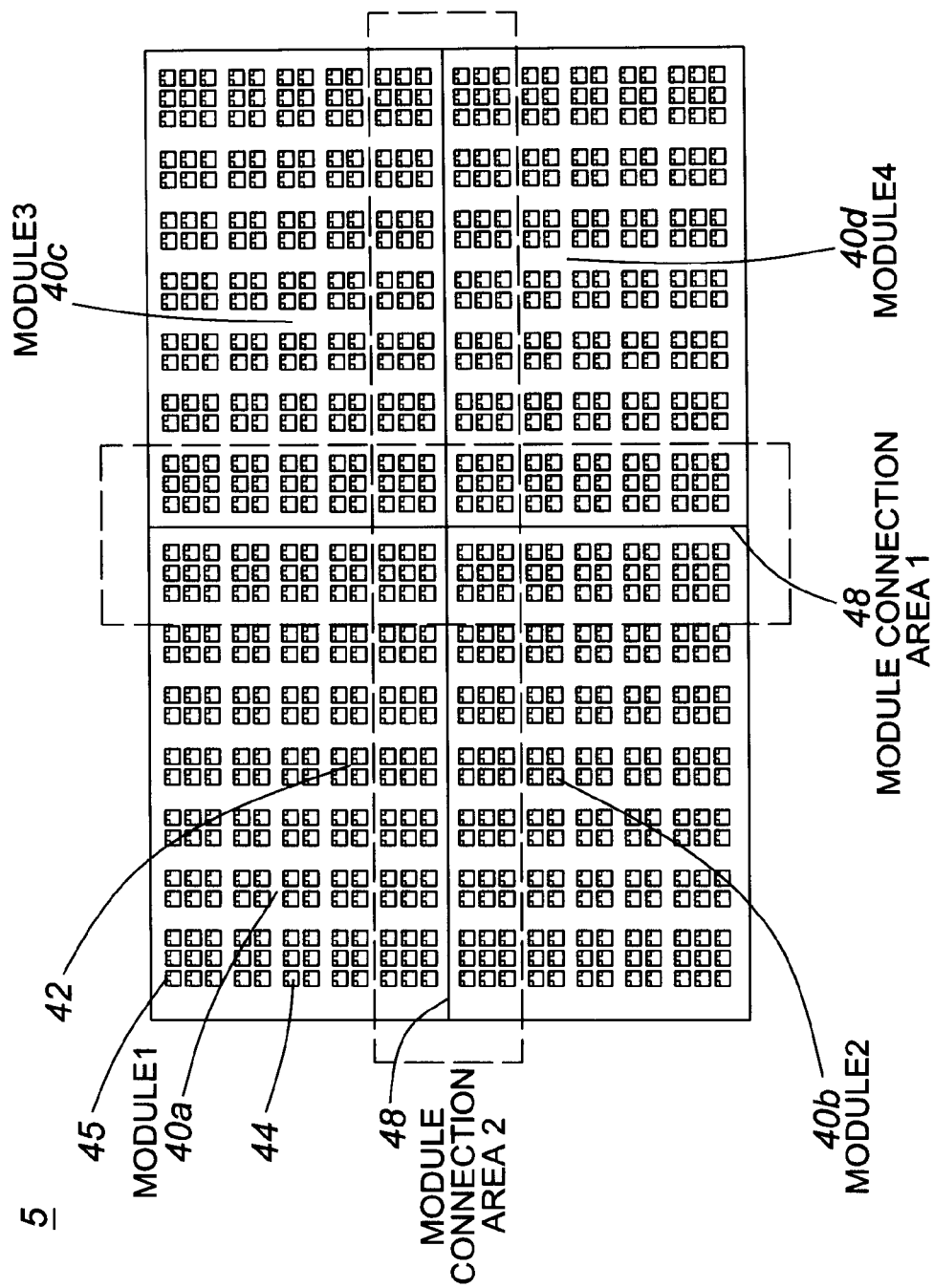
FIG. 7 shows schematically a LED array light source according to another embodiment of the present invention comprising a rectangular array fabricated from four rectangular LED array modules which are abutted to form a large area array and wherein each module comprises an arrangement of middle, edge and corner clusters of LED die.

Thus, for example, a modular LED array light source assembly according to another embodiment is shown in FIG. 7, which comprises 4 rectangular arrays 40a, 40b, 40c and 40d that are assembled, i.e. abutted, along edges 48 to form a large area rectangular array 5. Each LED array module 40a, 40b, 40c, 40d comprises a plurality of individual LED die 12 arranged in clusters 42, 44 and 45. Central or middle clusters 42 each comprise 4 LED die. Corner clusters 45 each comprise 9 LED die. Edge clusters 44 along each side comprise 6 LED die. This arrangement therefore provides an increased density of LED die near edges 48 of the LED array module substrate 46 that abut other modules in the connection areas 49.

Figure 8:
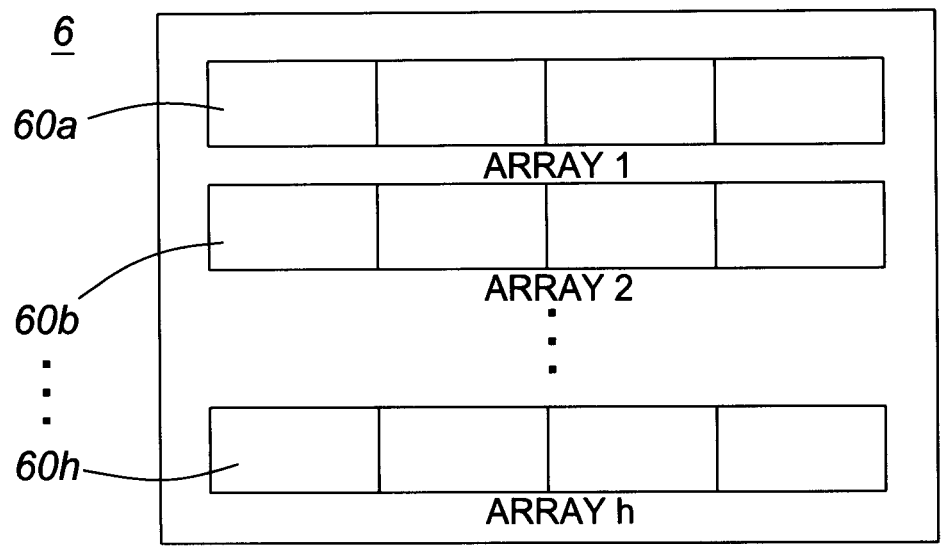
FIG. 8 shows an embodiment of an LED array light source assembly comprising an arrangement of array light sources, each comprising a plurality of LED array modules on a common substrate.
Figure 9:
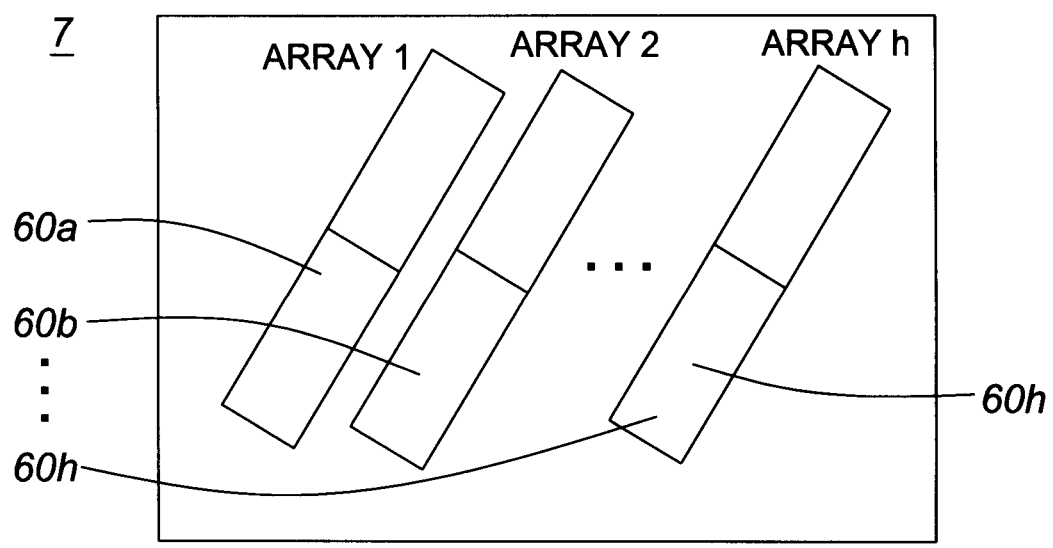
FIG. 9 shows another embodiment of an LED array light source assembly comprising an LED array light source arranged in a staggered configuration, wherein each comprises a plurality of LED array modules on a common substrate.

In other embodiments, it will be appreciated that many other arrangements comprising assemblies of two or more LED modules in various configurations are contemplated. For example, a modular LED array light source assembly 6 according to a third embodiment is shown in FIG. 8 and comprises a plurality h of LED arrays 60a, 60b . . . 60h, arranged to form a rectangular array with spaces between arrays and with the LED arrays being arrange in parallel. Each array 1, 2 . . . h may be similar to those shown in FIG. 3A comprising several LED array modules. An LED array light source assembly 7 according to a fourth embodiment is shown in FIG. 9, and comprises a plurality of LED array modules 60a, 60b . . . 60h, arranged in an angled or staggered arrangement.

Figure 10:
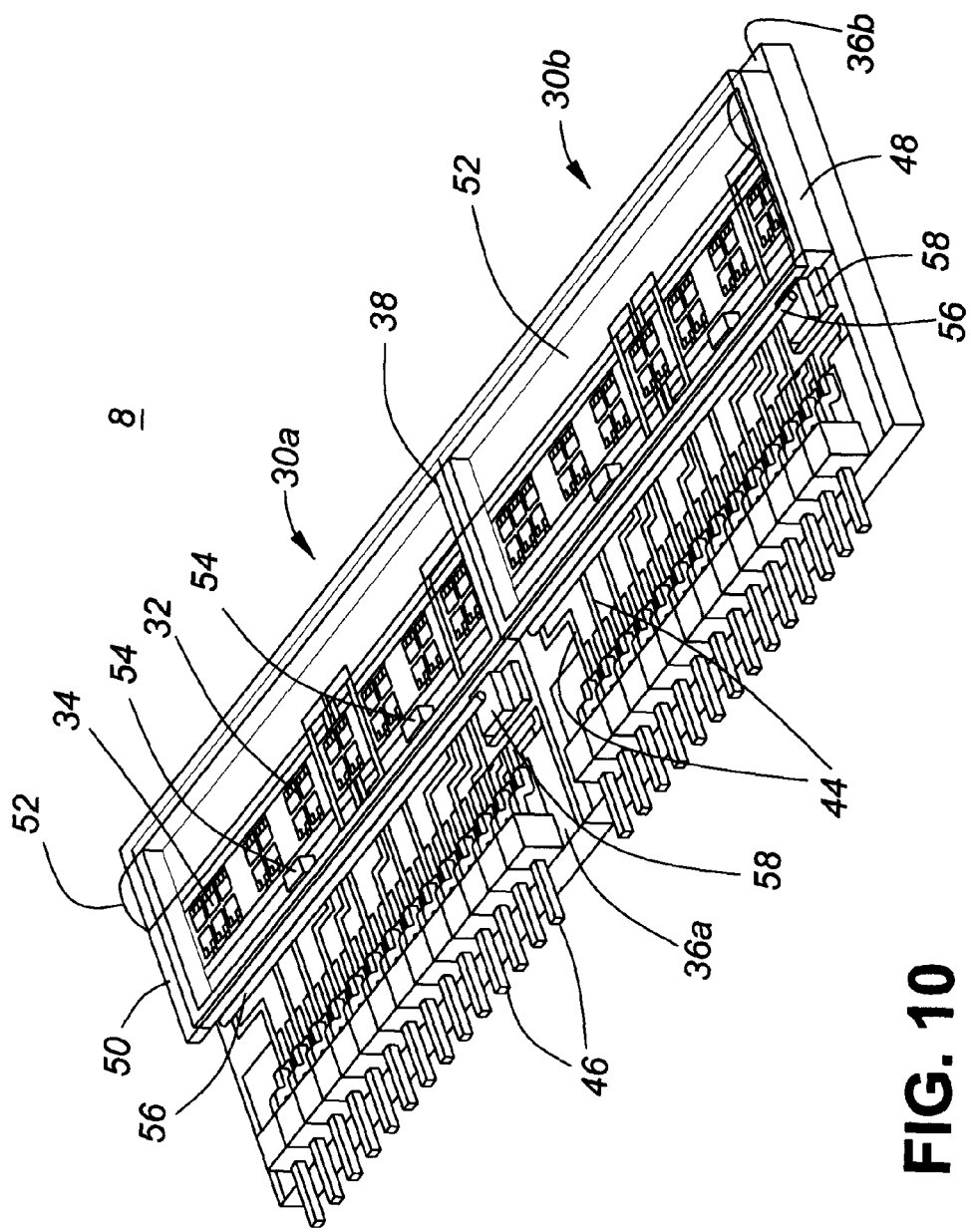
FIG. 10 shows a schematic diagram of a perspective view of an LED array light source comprising two LED array modules.
Figure 11:
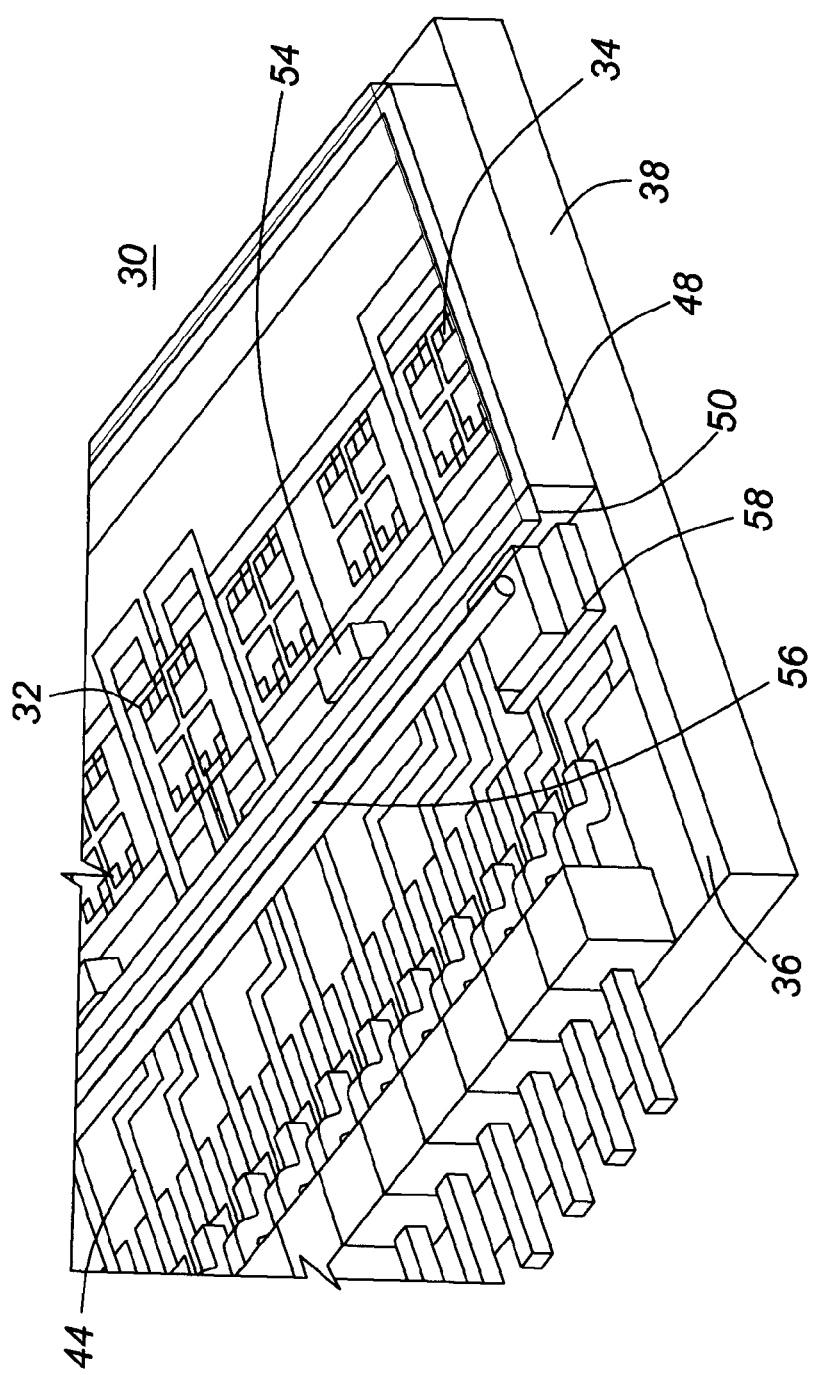
FIG. 11 shows an enlarged perspective view of part of one end of an LED array module 30 shown in FIG. 10.
Figure 12:
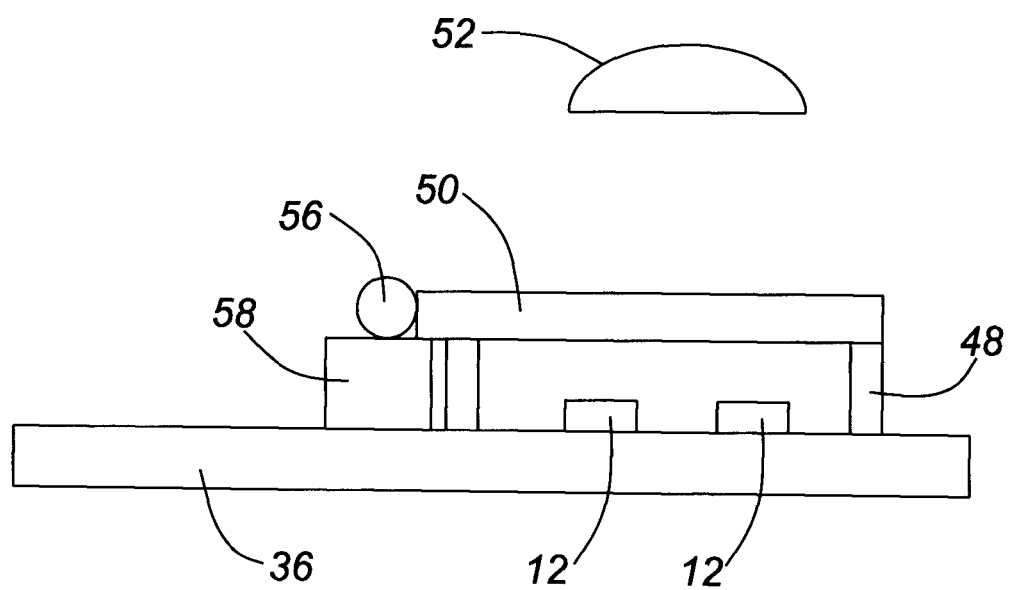
FIG. 12 shows a schematic cross-sectional diagram through one of the LED array modules shown in FIG. 10, to show arrangement of the optical monitoring elements comprising a fluorescent fiber sensor.

A modular UV or visible (UV-V) LED array light source assembly 8 according to a preferred embodiment of the invention, suitable for use in a UV photo-curing apparatus, for example, is shown schematically in FIG. 10, comprising two UV LED array modules 30a and 30b. In a preferred arrangement, each module comprises middle clusters 32 of 4 LED die arranged periodically with a regular spacing x and larger end clusters 34 of 6 LED die are provided at each end to compensate for edge effects or wall effects near edges 38 of the substrate 36. The LED array modules 30a, 30b may be mounted on a suitable substrate (not shown) such as the heat sink of a cooling means. Each module substrate 36 provides an area 40 adjacent each linear array, to accommodate interconnect 42 for connection to drive/control circuitry (not shown in the drawings). That is, interconnect structures 42 comprise electrical contact pins 46 for powering and controlling each cluster 32, 34 of LED die of an LED array. A wall 48 of the package of each LED array module surrounds the LED die, and an overlying optical window 50 is hermetically sealed to the wall 48. One or more optical elements, in this example, one cylindrical lens 52, spaced from the array and extending along the length of both modules, is provided to shape, i.e. focus or spread, the beam profile of the optical output from the LED array modules 30a, 30b at an appropriate working distance. Other views of these elements are also illustrated in FIGS. 11 and 12.

Preferably the package is hermetically sealed, which requires a minimum edge wall thickness of wall 48 as determined by the packaging technology. Alternatively, the array may be encapsulated or sealed by other conventional means, such as epoxy, or other encapsulant, which also requires that the module substrate extends a certain minimum thickness around the array for effective sealing. Also preferably, the LED module package has a substrate 36 having a high thermal conductivity to provide for improved thermal management in an array with high density of LED die. A light source assembly comprising a plurality of LED array modules may comprise a suitable cooling system. For example, the substrates 36 of the LED array modules may be mounted in thermal contact with a suitable cooling structure such as a heatsink and/or liquid cooling or other conventional thermal management system.

Beneficially, each module includes a temperature sensor, e.g. one or more thermistors 54 for measuring/monitoring operational temperature, and an optical sensor, e.g. an optical fiber sensor for optical monitoring (described in more detail below), which comprises a light guide 56 and external photodiode detector 58 for sensing an operational state (i.e. on/off/failure, etc.) of each module 30a, 30b.

A conventional LED driver (not shown) provides for driving of the LEDs individually or in groups. The LEDs are preferably driven in groups and because there is a large voltage drop over each group it is advantageous to have a parallel configuration. Using multiple inputs for driving, e.g. the first 8 groups driven by a first input, the next 8 group are driven by next input, and so on, provides for improved uniformity. Off the shelf driver chips may be used.

In-Situ Optical Monitoring

One known method of monitoring the change in optical power of the array is to embed photodiodes in the array as described in copending US patent publication No. 2005/0230600, i.e. some of the light emitting diodes in a large area array are configured as photodiode detectors for monitoring output from the light emitting diodes. However, multiple photodiodes are needed to monitor the entire array. An arrangement using multiple photodiodes tends to be costly. Photodiodes take up valuable area in the array, and may affect the uniformity of irradiance. Lower cost or alternative methods of monitoring the output of large area diode array modules are desirable.

In a preferred embodiment according to another aspect of the present invention a light emitting diode array module is provided having optical monitoring means comprising a fluorescent fiber optically coupled to the LED module window to detect changes in output power at any point in the array. That is, light emitted from the LEDs is coupled to the side of the fiber light guide from the edge of the optical window along the length of a LED module. The fiber is caused to fluoresce, and fluorescence is guided through the fiber to the photodetector. Thus, light from multiple LEDs is collected externally using a single photodiode per module.

In operation, any change in light detected by the photodiode can be used to detect overall degradation of the LED array, or for example will detect a change in status of any individual LEDs, e.g. if one is out or has failed. Alternatively in a test sequence, monitoring of the optical output detected by the photodiode while individual LEDs, or clusters of LEDs are energized enables detection of degradation or failure of individual or groups of LEDs.

As shown in the light source assembly in FIG. 10, each LED array module includes an optical sensor comprising a photodiode 58, and a corresponding fluorescent fiber light guide 56 extending along one edge of the optical window 50 of each array. Part of one module also shown in an enlarged view in FIG. 11, with the cylindrical lens 52 removed, for clarity. FIG. 12 shows a cross-sectional schematic view one LED array module, showing the alignment of the fluorescent fiber light guide 56 and photodiode 58 which are provided for monitoring the output intensity of the LED array, and detecting a change in output, e.g. due to aging or if one or more LED die fail. The use of a fluorescent fiber enables monitoring of the light output of the entire array module using only one photodiode per module. During normal operation, light emission from the LED die causes fluorescent emission from the fiber, which is guided to the photodiode. A change in output from the fiber is indicative of a problem or failure of one or more die in the array module can be detected.

The enlarged view of part of FIG. 10 is shown in FIG. 11, and the cross-sectional view in FIG. 12 shows the alignment of the fluorescent fiber 54 along one edge of the optical window 50 to collect a sample of light emitted by the LED array, exciting fluorescence in the fiber, which is guided to be detected by the photodiode to the photodiode 58. The fluorescence emitted by the fluorescent fiber is at a different wavelength (i.e. longer wavelength) from the light emitted by the LEDs of the array, and so that then the detected emission can be separated more easily from the background or UV irradiation.

In a test sequence, sequential powering of individual clusters and observation of fluorescence from the fiber can identify inoperative or defective operation of one or more clusters or individual die. Incorporation of multiple photodiodes into each LED array module for monitoring purposes is usually required to do this. Thus, this arrangement using a fluorescent fiber provides for lower cost monitoring system, which reduces the number of photodiodes required to effectively monitor a large array.

Each module has an optical sensor comprising one photodiode and a fluorescent optical fibre for monitoring the operation status of each module. Also shown are two thermistors for each module.

Figure 13:
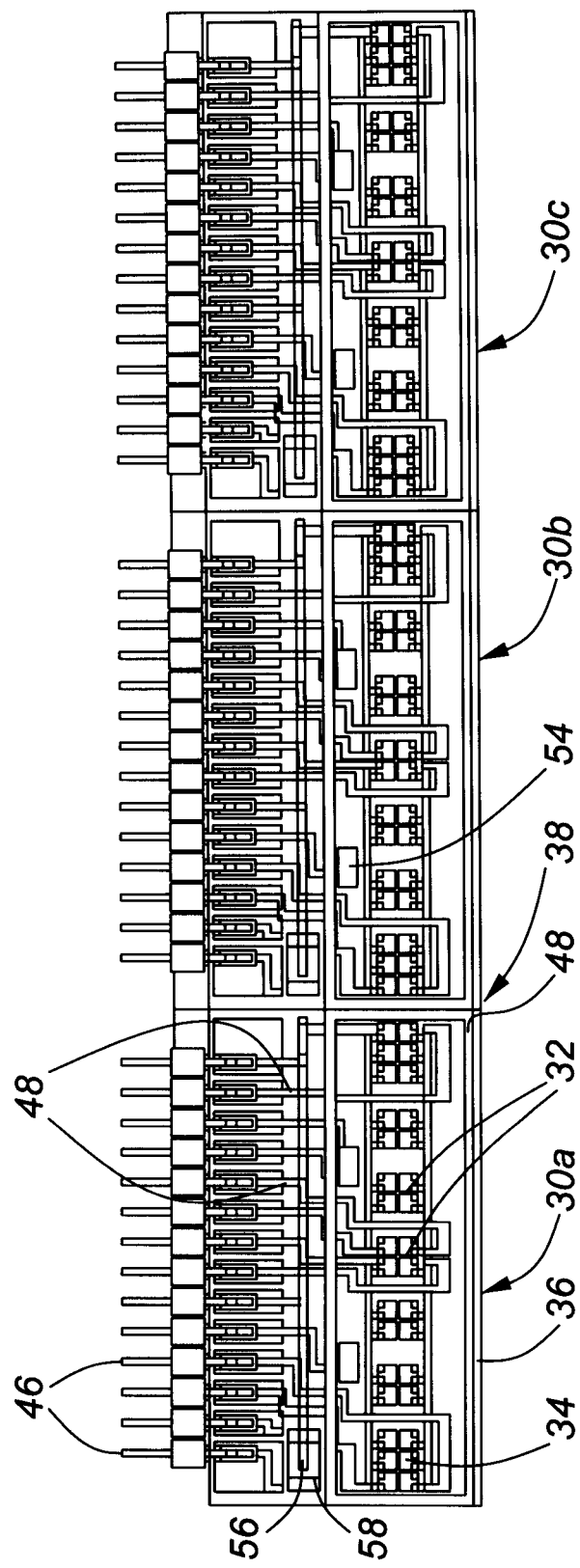
FIG. 13 shows a lateral view of a light source assembly for a photo curing apparatus according to another embodiment, which comprises three LED array modules.

While the embodiment illustrated in FIG. 10, comprises two modules 30a and 30b, in other embodiments, more modules may be abutted to form a longer LED array light source assembly, e.g. for large area photo-curing. For example, a lateral view of a similar assembly comprising 3 modules, 30a, 30b, 30c, abutted to form a longer array light source is shown in FIG. 13. Each module comprises middle 32 and end clusters 34 of LEDs arranged with suitable spacings to provide a light source of a desired length which provided substantially uniform irradiance along the length of the module as described above. Each module comprises an optical window hermetically sealed around the ring frame or wall 48 of the LED packaging. Each module comprises a photodiode 58 and fibre light guide 56 for optical monitoring, and a pair or thermistors 54 for thermal monitoring, together with electrical contact pins 46 and interconnect 48.

As will be appreciated, in alternative embodiments, the modular LED array light source may comprise other arrangements of LED modules, optical sensors and temperature sensors.

Array Optics

Preferably each LED array light source comprises optical elements, e.g. one or more cylindrical lens or reflectors, for increasing or maximizing the irradiance at the substrate and shaping the beam profile from the LED modules. Typically, packaged LEDs are designed with spherical reflectors and lenses or alternatively LED arrays are formed by multiple LEDs each with its own reflector and/or lens (see for example, U.S. Pat. No. 7,071,493B2).

Figure 14:
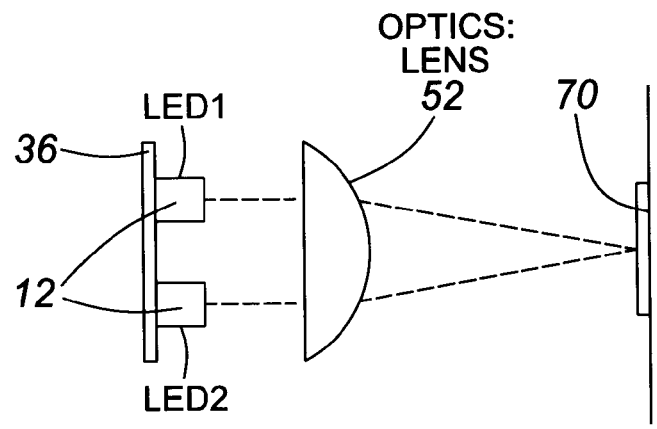
FIG. 14 shows a schematic cross-sectional view through one LED array module comprising pairs of LED die and an optical element comprising a cylindrical lens.
Figure 15:
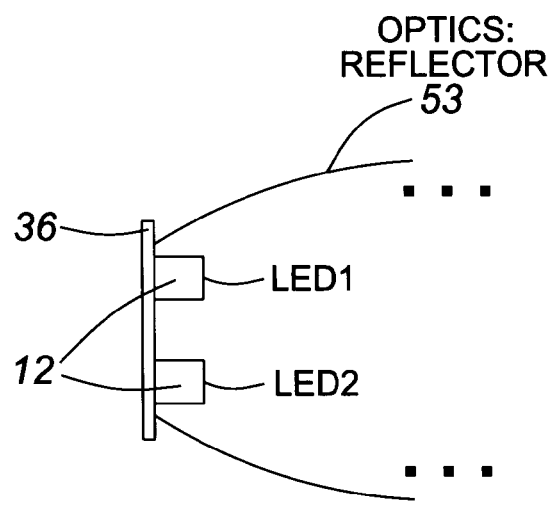
FIG. 15 shows a schematic cross-sectional diagram of an LED array module comprising pairs of LED die and an optical element comprising a reflector configured to improve coupling efficiency and provide a wide beam profile.
Figure 16:
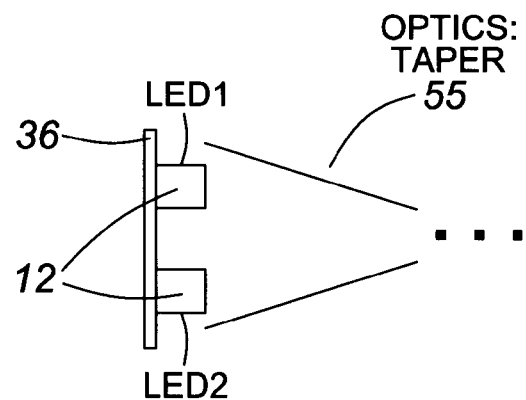
FIG. 16 shows a schematic cross-sectional diagram of an LED array module comprising pairs of LED die and an optical element comprising an optical taper configured for increased irradiance (power density) and a narrow beam illumination beam profile.

A cross-sectional view through an LED array module showing some alternative arrangements of optical elements are illustrated in FIGS. 14, 15, and 16. FIG. 14 shows a cross-sectional view through an LED module showing a pair of LED die 12 mounted on the substrate 36, with a single cylindrical lens 52, similar to that shown in FIG. 10. FIG. 15 shows a schematic cross-sectional diagram of an LED array module comprising pairs of LED die 12, on a substrate 36 and an optical element 53 comprising a cylindrical reflector configured for improved coupling efficiency and to provide a wide beam profile. FIG. 16 shows a schematic cross-sectional diagram of an LED array module comprising pairs of LED die 12 and an optical element 55 comprising an optical taper configured for increased irradiance (power density) and a narrow beam profile.

Figure 17:
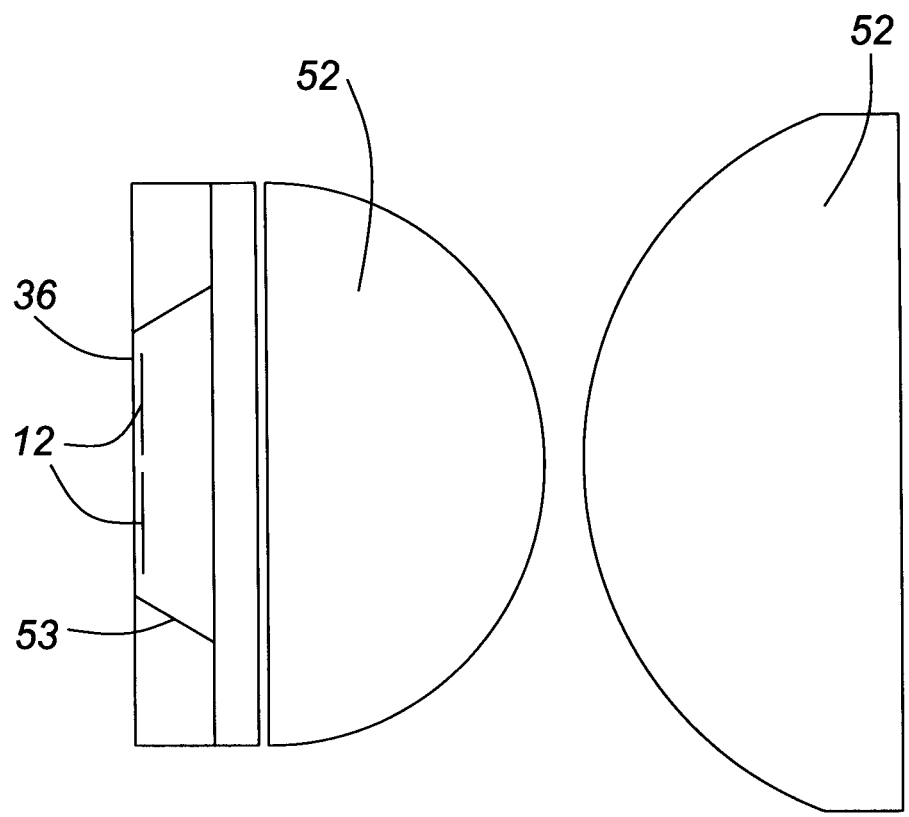
FIG. 17 shows a cross-sectional view through a linear LED array module according to an embodiment comprising a linear array of pairs of LEDs arranged in a cylindrical reflector, and a cylindrical lens pair for increased irradiance and shaping the beam profile.

FIG. 17 shows a cross-sectional view through a linear LED array module according to another embodiment comprising a linear array of pairs of LEDs 12 arranged in a cylindrical reflector 57, and a cylindrical lens pair 52a and 52b for increasing irradiance at the substrate and shaping the beam profile.

Figure 18A:
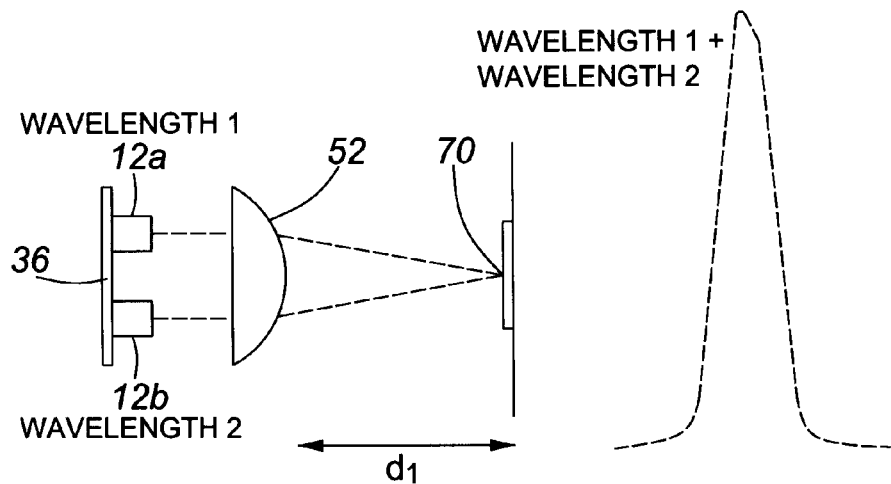
FIGS. 18A and 18B show a cross-sectional view through a linear LED array module according to an embodiment comprising a linear array of pairs of LEDs emitting first and second different wavelengths and a cylindrical lens for shaping the beam profile, at first and second working distances to show mixing of wavelengths and separation of wavelengths, respectively.
Figure 18B:
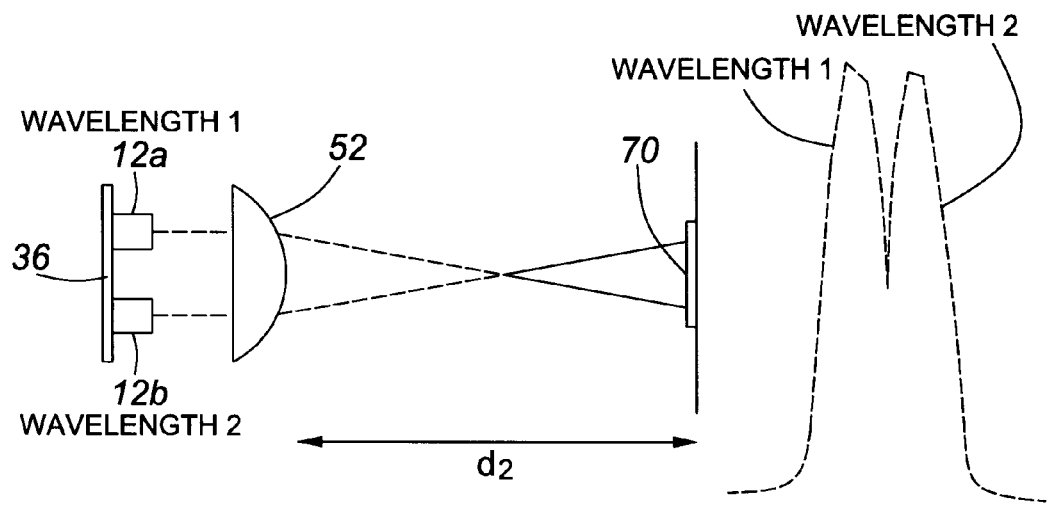

FIGS. 18A and 18B shows a cross-sectional view through a linear LED array module according to an embodiment comprising a linear array of pairs of LEDs 12a and 12b emitting first and second different wavelengths and a cylindrical lens 52 for shaping the beam profile, at first and second working distances $d_1$ and $d_2$ from a coating 70 to be cured, to show mixing of wavelengths and separation of first and second wavelengths, respectively.

For linear arrays as described above, and disclosed in the above referenced related U.S. patent application Ser. No. 61/161,281, an optical element such as a lens or reflector with cylindrical geometry has some benefits. For example, use of a cylindrical optical element may provide for distributed pulses of light and may be used for applications with moving substrates, such as digital printing and conveyer flood curing; a focusing lens and reflectors may be used to increase the energy density (irradiance) in a plane perpendicular to the moving substrate at a specific working distance; a single lens and/or reflector can be used per linear array, and thus reduces the amount of space needed between LED die relative to providing individual lenses or reflectors for each die, and allows for greater packing density of LED die in one dimension.

Dual Wavelength or Multi-Wavelength Irradiation

As illustrated in the embodiments shown in FIGS. 10, 11 and 12, a single cylindrical lens 52 is provided for focusing of the output of the clusters 32, 34 of LED die 12 of the LED array modules 30a, 30b. Where the LED array 8 comprises pairs of LED die arranged in two rows to form clusters as described above, each LED pair may comprise a first LED emitting a first wavelength, e.g. 400 nm and a second LED emitting a second wavelength e.g. 365 nm. By adjusting the working distance from the substrate to be cured, a line of illumination comprising both first and second wavelengths can be focused onto the substrate as shown in FIG. 18. Alternatively, for example, by increasing the working distance, separated lines of illumination of each of the two wavelengths can be directed onto the substrate to be cured as shown in FIG. 18B. The ability to provide irradiation at two wavelengths provides flexibility to control irradiation for inks and coatings of different formulations, for different applications and substrates, or where inks and coatings of different colours have different absorption or reflection characteristics. Selection of the appropriate radiation with a specific wavelength or combination for multicolour printing or coating is facilitated.

Although a particular embodiment has been described relating to use of modular LED array light sources comprising UV LEDs for photocuring, alternatively or additionally, LEDs emitting short wavelength visible wavelengths, such as 400 nm, may be used for photocuring. LED sources emitting other wavelengths, visible or infrared, may alternatively be used as appropriate for effecting photo curing or photo-initiation of other reactions, which require other wavelengths. Different wavelengths may be used for specific effects, such as for surface curing or providing surfaces with different appearances, for example.

It is also known that the appearance of a cured ink or coating film may be affected by selectively applying different wavelengths of UV radiation at different stages of the curing process. For example, applying a certain amount of 365 nm UV radiation at a controlled irradiance ahead of 400 nm radiation to cure a pigmented coating will usually cause a matte surface finish, while using 400 nm UV before 365 nm UV will produce a more glossy surface finish. Also, adding some 365 nm UV to a 400 nm cure often provides improved surface cure of some inks and coatings. Suitable arrangements of optical elements and working distance may be used to provide individual spaced lines with different wavelengths, single lines with mixed wavelengths in which the relative amount (i.e. relative amplitude) of each wavelength may be controlled. The latter may be manually adjusted or automatically controlled. Thus, although in FIGS. 18A and 18B the two wavelengths are shown with beam profiles having the same intensity, different intensities may be used for each wavelength. Where automatic control of intensity or relative amplitude is provided, this selection may be programmable or adjusted during curing through feedback system sensing properties of the ink or coating during curing, or linked to other control signals such as the jetting nozzle control signals.

Alternatively, instead of a using a cylindrical lens as shown in FIGS. 18A and 18B, other optical elements, e.g. as shown in FIGS. 15, 16 and 17, mixed wavelength illumination may be provided using a cylindrical reflector 53 or a tapered optical element 55 to provide, respectively, a broad or narrow band of illumination or one wavelength or mixed wavelengths.

Modular LED array light sources according to embodiments described above provide for more uniform irradiance for applications such as photocuring or other photo-initiated processes. Other applications of such modular LED array light sources may comprise processes requiring large area illumination with substantially uniform irradiance, such as illumination or irradiation for monitoring and imaging for test or measurement, e.g. for process monitoring, quality control and other machine vision based applications. LED arrays may comprise solid state light emitting devices comprising one or more light emitting diodes, laser diodes, and OLEDs (organic light emitting diodes), for example. For photocuring applications, e.g. UV curing of photo-curable inks or coatings, LEDs may comprise UV LEDs, or short wavelength visible light LEDS.

INDUSTRIAL APPLICABILITY

A light emitting diode (LED) light source is provided comprising a plurality of LED modules in which modules are abutted to provide a large area, high intensity, and high-density array. Preferably, in each module a linear or rectangular array of groups of LED is provided, in which the density of LED die in the array is higher near ends or edges of the LED array, so that the average number of LED die per unit length of substrate across the end regions including an edge of the substrate abutting other modules is equal to number of the die per unit length in the middle regions of the array, to provide uniform irradiance over the illuminated area between modules. Thus, for example, by providing end clusters with one or more additional LEDs and selecting appropriate spacing of middle and end or corner clusters, edge or wall effects due to spacing of the LED die from edges of the substrate and packaging of each module, which causes a discontinuity or dip in irradiance between conventional modules, are avoided or reduced.

Modular LED array light sources that provide a wide band of illumination or irradiation with substantially uniform irradiance have applications for photocuring or photo-processing of large area substrates, such as UV photocuring, and other processes requiring uniform illumination such as monitoring or imaging for test or measurement applications.

Other embodiments provide a sensor and a method for monitoring the output of one or more LED array modules using a single photodiode coupled to a fluorescent light guide, preferably a fluorescent fiber light guide, which is optically coupled to a plurality of individual LEDs or groups of LEDs of the array module.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A modular light emitting device (LED) array light source, comprising:
    an assembly of a plurality of LED array modules;
    each LED array module comprising a module substrate carrying a plurality of LED elements arranged in an array, with edge portions of the substrate extending beyond the LED array, and
    at least one edge portion of the substrate abutting an edge portion of another module; and
    the spacings of LED light source elements of the array in each module being arranged to provide a higher density of LED elements at edges of the array where edge portions of two modules abut, said spacings being selected to provide a substantially uniform irradiance from module to module across edge portions where two modules abut.

2. An LED array light source according to claim 1 wherein a plurality of the LED array modules are abutted end to end along a length of the light source, and in each module:
    a central region of the module comprises central LED elements of the array arranged along a length of the substrate, and
    an end region of the module comprises LED elements of an end portion of the array and the edge portion of the substrate extends lengthwise beyond the LED array,
    the LED elements of the array being arranged to provide the same average number of LED elements per unit length of substrate in the central region and end region of each module.

3. An LED array light source according to claim 1 wherein in each module a central region of the LED array comprises a uniform periodic array of LED elements having a number n of die per unit length of the substrate, and an end region of the module near the edge of the array, wherein die are arranged, so that, including the edge portion of the substrate extending beyond the LED array, there is an equal number n die per length of the substrate in each end region abutting another module.

4. A LED array light source according to claim 3 wherein arrangement of LED die in central and end regions of a module maximizes the packing density of individual die.

5. An LED array light source according to claim 1, wherein each module comprises a periodic array of a plurality of middle clusters of LED die along a length of the array, and an end cluster of LED die at each end of the length of the array near edge portions of the module where two modules abut, and wherein each end cluster comprises a greater number of LED die than said middle clusters.

6. An LED array light source according to claim 5, wherein each middle cluster comprises at least one LED die and each end cluster comprises at least one additional LED die.

7. An LED array light source according to claim 5, wherein each middle cluster comprises at least one pair of LED die, and each end cluster comprises at least one additional pair of die.

8. An LED array light source according to claim 5, wherein each module comprises a linear array of LED die comprising middle clusters and end clusters of LED die, and each middle cluster comprises four LED die, and each end cluster comprises six LED die, and the spacing of end clusters and middle clusters is selected to provide substantially uniform irradiance along the length of the light source array from module to module.

9. An LED array light source according to claim 7, wherein a first LED of each LED pair emits a first wavelength and a second LED of each LED pair emits a second wavelength.

10. An LED array light source according to claim 9, wherein LED pairs are arranged in a linear array and wherein the light source further comprises cylindrical optical elements for mixing or separating light emission at first and second wavelengths.

11. An LED array light source according to claim 1 wherein each module comprises a plurality of middle clusters of m×n LED die and a plurality of end clusters of m×(n+1) LED die, dies in each cluster having a dimension w and being spaced by a distance x, each middle cluster being spaced by a distance v, and each end cluster being spaced from an edge of the substrate, so that where two modules abut, end clusters in adjacent modules are spaced by a distance U, and wherein $$U = v + \frac{2}{n}(v - x).$$

12. An LED array light source according to claim 1, wherein each LED array module comprises a rectangular array of LED die, each rectangular array comprising middle clusters, edge clusters and corner clusters of LED die, and wherein the number of die in each cluster and the spacings of middle, edge and corner clusters are selected to provide said substantially uniform irradiance from module to module.

13. An LED array light source according to claim 11, wherein edge portions of each module substrate extend outwardly around the LED light source elements of the array for packaging of the array comprising a seal surrounding LED of the array.

14. An LED array light source according to claim 1, wherein the module substrate comprises part of a module package, the module package further comprising a wall extending from edge portions of the substrate surrounding the LED light source elements of the array and an overlying optical window hermetically sealing LEDs of the array with the module package.

15. An LED array light source according to claim 14, further comprising cooling means comprising a heatsink and wherein substrates of said plurality of light source modules are supported in thermal contact with the heatsink.

16. An LED array light source according to claim 1, wherein a first plurality of LEDs in each array emit a first wavelength and a second plurality of LEDs in each array emit a second wavelength, different from the first wavelength, and wherein the light source further comprises optical elements for mixing or separating emission at first and second wavelengths.

17. An LED array light source according to claim 1 wherein LEDs comprise solid state light emitting devices comprising one or more of light emitting diodes, laser diodes, and OLEDs (organic light emitting diodes).

18. An LED array light source according to claim 17, for a photocuring apparatus comprising LEDs for emitting a wavelength suitable for initiating a photoreaction.

19. An LED array light source according to claim 17, for a photocuring apparatus wherein LEDs comprise UV LEDs for UV photocuring.

20. An LED array light source according to claim 1 comprising an arrangement of a plurality i of LED array modules, each module having a length L, abutted end to end, to provide a light source of length i×L, wherein the arrangement of LED die in each array module provides for substantially uniform irradiance along the length i×L.

21. A modular LED light source array according to claim 1 providing a large area, high brightness optical output for photo-curing, photo-initiated reactions, other photo-induced industrial processing of films and coatings, and process monitoring thereof.

22. An LED array module for a modular light source comprising an assembly of a plurality of LED array modules, each module comprising:
a substrate carrying a plurality of LED die arranged in an array on the substrate with edge portions of the substrate extending beyond the array,
the spacings of LED die of the array being arranged to provide a density of LED die in a central region of the array and a higher density of LED die at edges of the array adjacent edge portions for abutment with another module, said spacings being selected to provide a substantially uniform irradiance from module to module across edge portions in the assembly.

23. An LED array module according to claim 22, wherein the central region of the array comprises a periodic array of a plurality of middle clusters of LED die along a length of the array, and an end cluster of LED die at each end of the length of the array adjacent edge portions, each end cluster comprising a greater number of LED die than said middle clusters.

24. An LED array module according to claim 22, wherein the substrate comprises part of a module package, the module package having a wall extending from edge portions of the substrate around the LED die of the array, and an optical window overlying the array and hermetically sealed to the wall of the package.

25. An LED module according to claim 24, further comprising an optical sensor comprising a fluorescent fiber light guide extending along one side of the length of the array and aligned to an edge of the optical window to receive a portion of the optical output from the LED array, and a photodetector optically coupled to an output of the fluorescent fiber light guide to receive fluorescence output from the fiber light guide indicative of the operational status of the array, said fluorescence output being wavelength shifted from the optical output from the LED array.

26. An LED module according to claim 22, wherein each module comprises a plurality of middle clusters of m×n LED die and a plurality of end clusters of m×(n+1) LED die, dies in each cluster having a dimension w and being spaced by a distance x, each middle cluster being spaced by a distance v, and each end cluster being spaced from an edge of the substrate, so that where two modules abut, end clusters in adjacent modules are spaced by a distance U, and wherein $$U = v + \frac{2}{n}(v-x).$$

27. An LED module according to claim 22, further comprising optical sensor means comprising:
   a light guide extending along the length of the LED array adjacent the array and aligned to receive a portion of the optical output from the LED array; and
   a photodetector optically coupled to receive light from an output of light guide for monitoring the operational status of the array.

* * * * *